United States Patent [19]
Kempf

[11] 4,267,088
[45] May 12, 1981

[54] SOLVENT RESISTANT INKS AND COATINGS

[75] Inventor: Paul S. Kempf, P.O. Box 690, Solana Beach, Calif. 92075

[73] Assignee: Paul S. Kempf, Trustee or Successor Trustee

[21] Appl. No.: 74,980

[22] Filed: Sep. 13, 1979

[51] Int. Cl.³ .................... C08L 79/00; C08L 63/00
[52] U.S. Cl. .............................. 260/29.2 EP; 106/20; 106/22; 106/23; 260/DIG. 38
[58] Field of Search ............... 260/29.2 EP, DIG. 38; 528/421, 424; 525/540; 106/22, 23, 20

[56] References Cited
U.S. PATENT DOCUMENTS 3,277,128  10/1966  van der Voort .................. 528/424
3,520,774   7/1970  Roth ................................. 528/424

Primary Examiner—Theodore E. Pertilla
Attorney, Agent, or Firm—Brown & Martin

[57] ABSTRACT

Coatings particularly useful as marking inks in which an epichlorhydrin-modified polyethylenimine and an ethylene oxide-modified polyethylenimine cooperate in aqueous solution to form a composition capable of application to form deposits adherent to most materials and resistant to most organic solvents but readily removable by water.

6 Claims, No Drawings

SOLVENT RESISTANT INKS AND COATINGS

FIELD OF THE INVENTION

This invention relates to solvent-resistant inks and coatings particularly for temporary marking of printed circuit boards.

BACKGROUND OF THE INVENTION

In the manufacture of printed circuit boards in the electronics industry there is a need for an ink for marking printed circuit boards and electronic components which will not be removed by the solvent baths and vapor degreasers used to clean the completed printed circuit boards in the final stages of manufacture. At the present time the only inks which do this are (1) Thermosetting inks or (2) Epoxy inks.

The thermosetting inks are satisfactory for individual components which are designed to stand the baking temperatures but not for marking on assembled printed circuit boards where there are also components which will not stand the baking temperatures. The epoxy inks must be mixed at the time of use and have a pot life usually of less than one hour. They also require periods of more than an hour to harden to the point the printed circuit boards may be handled without smearing the ink. Epoxy inks also do not stand extended solvent vapor degreaser action with good predictability. They may come off some surfaces and stick on others. It is desirable also that there be a method of removing the ink without destroying other markings on the component or printed circuit boards.

In hospitals and chemical laboratories there is a need for an ink for bottles and specimens which will not be attacked or dissolved by organic solvents in the bottles or used in processing.

OBJECTS OF THE INVENTION

It is an object of the present invention to provide a solvent-resistant ink or coating which can be applied easily with conventional applicators, such as a marking pen, and which does not require mixing or baking, but will harden in a few minutes at room temperature.

It is a further object of the invention to provide a solvent-resistant ink or coating composition which is readily removed without destroying other markings.

DESCRIPTION OF THE INVENTION

The present coating composition and ink secure a combination of strong adherence to a wide variety of hard-to-stick material and superior resistance to removal by organic solvents through the interaction of a epichlorhydrin-modified polyethylenimine (I) and an ethylene oxide-modified polyethylenimine (II). The product is formed by mixing an aqueous solution of (I) with an aqueous solution of (II), together with, preferably a small proportion of volatile alcohol and a pigment or dye.

A 17% solution of epichlorhydrin-modified polyethylenimine is acidic with an initial PH of 5.5 to 6.0 and becomes more acidic on standing, while on the other hand, a 37% solution of ethylene oxide-modified polyethylenimine is alkaline with a PH of 12 and has been suggested as a cationic emulsifier, a film forming amine in coating and printing inks and as a cationic modifier for clays and starches. In the present compositions from about 7 to about 15, preferably from about 7 to 10 parts by weight of the former is combined with one part of the latter.

Surprisingly, although one of these materials is acidic and the other is a cationic emulsifier, a mixture of these solutions in the range of relative proportion of the composition of the present invention is stable over a period of months. But, when the composition is spread as a thin film or a marking, the film or marking hardens quickly, e.g. in from 3 to 5 minutes, to a state strongly resistant to a wide variety of solvent liquids and vapors. Additionally the mixture will hold pigments in suspension for a substantial period, and where pigments have settled after long standing, they are readily redispersed.

Epichlorhydrin-modified polyethylenimines useful in the composition of the present invention have the typical chemical structure:

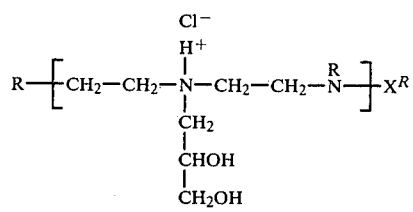

R=H or continuation of polyamine chain Ethylene oxide-modified polyethylenimines for use in the present compositions are ethoxylated water-soluble polymers formed by the reaction of relatively high molecular weight, i.e. 40,000 to 60,000 polyethylenimines with ethylene oxide and have the typical chemical structure:

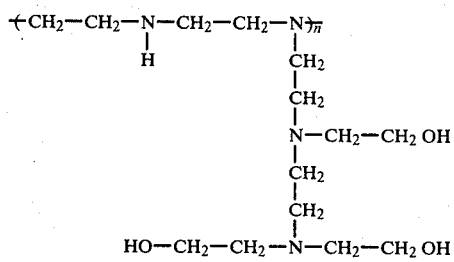

These modified polyethylenimines are available as aqueous solutions which are mixed in proportion to give a ratio of from about 5.2 to about 3.3 parts by weight of the epichlorhydrin-modified polyethylenimines to one part by weight of the ethylene oxide-modified polyethylenimines. Commercially available solutions of the epichlorhydrin-modified polyethylenimines and of the ethylene oxide-modified polyethylenimines have polymer contents of 17% and 37% respectively. The polymeric content of the mixture of solutions is preferably not more than about 19.5% of the weight of the mixture based on the weight of the mixture.

Mixing involves only bringing the solutions together with, preferably, a small amount, suitably up to about 10% by weight based on the weight of the polymer mixture of a volatile alcohol such as methanol, ethanol or isopropanol, and with pigment or dye, if desired, and agitation to give uniformity. Where the composition is to include pigment, the polyethylenimines, alcohol and pigment may be mixed in a ball mill until homogeneous. Any pigment may be used such as carbon black, titanium dioxide, calcium fluoride, or the T Series Dayglo pigments (product of the Dayglo Color Corp.). It has been found that from about 25% to about 35% of pigment by weight based on the weight of the composition forms a stable suspension.

Any dye with satisfactory solubility characteristics and which does not have undesirable reactions with the polyethylenimines may be used. Suitable dyes include rhodamine, gentian violet and methyl blue.

The compositions prepared by mixing the above commercially available solutions have a viscosity comparable to light cream. The thickness of the composition is higher at higher PH levels. A preferred PH is about 4.5 and the PH should not exceed 8 in order to avoid gelling. If desired, the compositions may be diluted with water and the viscosity adjusted by addition of thickening agents such as, methyl cellulose or fumed silica (Cabosil).

The composition may be applied to surfaces by conventional applicators and has viscosity and thixotropic characteristics such that the composition will not run readily when applied to a vertical surface. Where the composition is a pigment-containing marking ink, a "squeeze type" marking pen or an air operated plunger type marking device is satisfactory.

The composition has been found to adhere strongly to virtually any metal, glass, ceramic or plastic surface, including, gold, polyethylene, epoxy resins, polyesters (such as the material sold under the trademark "Mylar" and solder resist and will mark polytetrafluoro-ethylene material such as that sold under the trademark "Teflon". The coating or marking after application and hardening has a consistency and adhesion such that it can be scratched by local abrasion rather than having an entire chip of ink, such as a dot, fly off with abrasion. For example, a line can be scratched through the hardened material without removing the material on either side of the scratch.

The coatings or markings have shown outstanding resistance to the action of the wide variety of solvent liquids and vapors. They have withstood vapor degreasing and boiling or washing in such active solvents as trichloroethylene, acetone, Freon, cyclohexane, methyl ethyl ketone, ethylene chloride, naphtha and carbon tetrachloride for periods in excess of 15 minutes.

The hardened markings or coatings can be removed readily by soaking in water. The marking or coating softens immediately on immersion even in cold water and removal may be accomplished in the final cleaning of an article. For example, the detergent wash used in cleaning marked or coated article allows rapid removal by brushing. Immersion in hot water removes the coating or marking rapidly with what appears to be an almost effervescent action.

The following examples are given to aid in understanding the invention, but it is to be understood that the invention is not limited to the particular materials proportions or procedures of the examples.

EXAMPLE I

| Formula | |
| --- | --- |
| 100 grams | 17% Solids aqueous solution of epichlorhydrin-modified polyethylenimine.* |
| 55 grams | Pigment (T-Series Dayglo) |
| 10 grams | 37% Solids aqueous solution of ethylene oxide-modified polyethylenimine.** |
| 4 ml | Isopropyl alcohol |

-continued

*A commercial product, 86-X is available as a low viscosity water solution having the following representative structure and typical properties:

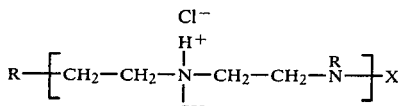

| Specific gravity | 1.055 |
| --- | --- |
| Non-volatile matter | 17% |
| Viscosity, cps | 20 |
| pH | 5 |
| Color, APHA | 100 |
| Appearance | Light yellow liquid |

The pH of 86X exhibits a light downward drift with time. Thus, from an "as-produced" value of 5.5-6.0, the pH slowly declines to an equilibrium value of 4.0-4.5 after several months.

**A commercial product 61B is described by the supplier as an aqueous solution of an ethoxylated water soluble polymer formed by reaction of a relatively high molecular weight (40-60,000) polyethylenimine with ethylene oxide. In 61B approximately eighty percent of the available amine hydrogens of the bare polymer have been converted to hydroxyethyl groups. The following structure is representative of 61B, although it should not be construed as the only repeating unit of the product.

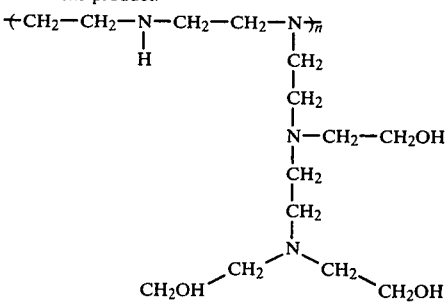

Thus 61B may be considered to be a giant alkanolamine, but of higher molecular weight and stronger cationic properties.

| Typical Properties | |
| --- | --- |
| Solids (Aqueous Solution) | 37% |
| Viscosity, cps, 25C | 3500 |
| Specific gravity | 1.08 |
| Pour Point, °C. | 0 |
| pH | 12 |
| Color, APHA max | 200 |

The materials were placed in a ball mill and mixed simultaneously together for about 20 minutes until homogeneous.

The result ink was filled into a "squeeze type" marking pen and used to mark the surfaces of gold, copper, glass, ceramic, polyethylene, epoxy resin and polyester articles. In each case the ink formed a smooth continous mark which did not run when applied to a vertical surface. When tested by scratching with a sharp point 5 minutes after application, the marks were found to adhere firmly such that lines were scratched through the markings without removing ink on either side of the scratch.

The marked articles were immersed in hot water and softened immediately for removal of the marking.

EXAMPLE II

The ink of Example I was applied to a series of glass slides. Four days after application, the slides were placed in glass beakers containing solvents as noted in the following table.

Solvents were introduced in amounts to cover the bottom ⅓ of each slide and the beakers were heated to bring the solvents to a boil so that the bottom ⅓ of the slides were in boiling solvent and the top ⅔ were in the vapors. A water-cooled copper coil was located at the tops of the beakers to condense the solvent vapors and return the condensate to the beakers.

| SOLVENT | TEST RESULTS | | COMMENTS |
| --- | --- | --- | --- |
| | TIME | RESULTS | |
| 1-1-1 Trichlorethane | 15 minutes | No effect | |
| Acetone | 15 minutes | No effect | Pigment faded slightly in immersed portion |
| Freon TA | 15 minutes | No effect | |
| Methyl Ethyl Ketone | 15 minutes | No effect | Pigment faded slightly in immersed portion |
| Ethylene Chloride | 15 minutes | No effect | Pigment faded some in immersed portion |
| Carbon Tetrachloride | 15 minutes | No effect | |
| Benzol | 15 minutes | No effect | |
| Ethyl Alcohol | 15 minutes | No effect | Pigment faded slightly in immersed portion |
| Mineral Oil | 15 minutes | Not removed | 550° F. pigment turned black |
| 1-1-1 Trichlorethane | 3 hours boil | No effect | |
| Gasoline | 15 minutes | No effect | |

What is claimed is:

1. A composition for depositing an organic solvent-resistant, water-removable coating comprising a solution in water of from about 3.2 to about 6.9 parts by weight of an epichlorhydrin-modified polyethylenimine (I) and one part by weight of an ethylene oxide-modified polyethlenimine (II).

2. A coating composition as defined in claim 1 in which said epichlorhydrin-modified polyethylenimine (I) has a repeating structure

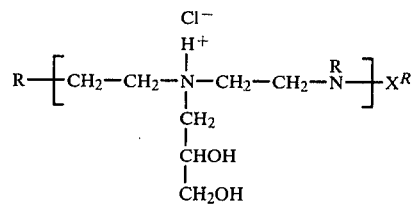

where R is H or a continuation of the polyamine chain and the ethylene oxide-modified polyethylenimine (II) has a repeating structure

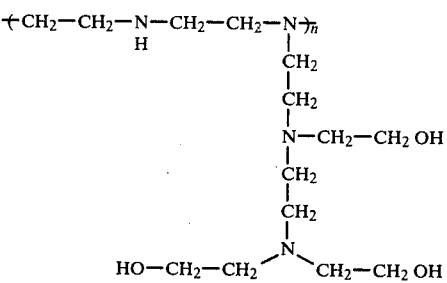

3. A coating composition as defined in claim 2 in which said modified polyethylenimines (I) and (II) are present in the ratio by weight of from about 3.3 parts to about 5.2 parts by weight of said modified polyethylenimine (I) to one part by weight of said modified polyethylenimine (II).

4. A coating composition as defined in claim 3 in which said composition is a marking ink and comprises a pigment suspended in said solution.

5. A coating composition as defined in claim 4 in which a 17% aqueous solution of said modified polyethylenimine (I) has a viscosity at 25° C. of 20 CPS. and a specific gravity of 1.055 and a 37% aqueous solution of said modified polyethylenimine (II) has a viscosity at 25° C. of under 3500 CPS. and a specific gravity of 1.08.

6. A coating composition as defined in claim 5 comprising from about 7 to about 10 parts by weight of said 17% solution of said modified polyethylenimine (I), about 1 part by weight of said modified polyethylenimine (II), from about 25% to about 35% by weight of pigment based on the weight of the composition up to about 10% by weight of a volatile lower alcohol based on the weight of the polymers.

* * * * *